US009178007B1

(12) United States Patent
Hua et al.

(10) Patent No.: US 9,178,007 B1
(45) Date of Patent: Nov. 3, 2015

(54) HIGH BREAKDOWN VOLTAGE METAL-INSULATOR-METAL CAPACITOR (71) Applicant: WIN Semiconductors Corp., Kuei Shan Hsiang, Tao Yuan Shien (TW)

(72) Inventors: Chang-Hwang Hua, Tao Yuan Shien (TW); Winson Shao, Tao Yuan Shien (TW); Ben Hsu, Tao Yuan Shien (TW); Wen Chu, Tao Yuan Shien (TW)

(73) Assignee: WIN SEMICONDUCTORS CORP., Kuei Shan Hsiang, Tao Yuan Shien (TW)

( * ) Notice: Subject to any disclaimer, the term of this patent is extended or adjusted under 35 U.S.C. 154(b) by 0 days.

(21) Appl. No.: 14/333,814

(22) Filed: Jul. 17, 2014

(30) Foreign Application Priority Data

Apr. 30, 2014 (TW) .............................. 103115596 A (51) Int. Cl.
  *H01L 29/92* (2006.01)
  *H01L 49/02* (2006.01)
(52) U.S. Cl.
  CPC ...................................... *H01L 28/40* (2013.01)
(58) Field of Classification Search
  None
  See application file for complete search history.

(56) References Cited

U.S. PATENT DOCUMENTS

| | | | | |
|---|---|---|---|---|
| 5,742,471 | A * | 4/1998 | Barbee et al. | 361/312 |
| 2009/0057738 | A1* | 3/2009 | Hirota et al. | 257/296 |
| 2010/0091428 | A1* | 4/2010 | Kim et al. | 361/313 |
| 2010/0164064 | A1* | 7/2010 | Kim | 257/532 |
| 2012/0200797 | A1* | 8/2012 | Adachi et al. | 349/43 |

OTHER PUBLICATIONS

Shi-Jin Ding et. al., "Atomic-layer-deposited Al2O3—HfO2 laminated and sandwiched dielectrics for metal-insulator-metal capacitors", J. Phys. D: Appl. Phys. 40 1072 (2007).*
Zhang, Q.X., et. al., "Full ALD Al2O3/ZrO2/SiO2/ZrO2/Al2O3 Stacks for High-Performance MIM Capacitors" IEEE Electron Device Letters, vol. 35, No. 11, Nov. 2014, pp. 1121-1123.*
Park, S. D., "Bulk and Interface effects on voltage linearity of ZrO2—SiO2 multilayered metal-insulator-metal capacitors for analog mixed-signal applications" Applied Physics Letters 95, 022905 (2009).*
Ching-Sung Ho; San-Jung Chang; Shih-Chang Chen; Liou, J.J.; Hongge Li, "A Reliable Si3N4/Al2O3—HfO2 Stack MIM Capacitor for High-Voltage Analog Applications," Electron Devices, IEEE Transactions on , vol. 61, No. 8, pp. 2944,2949, Aug. 2014.*
Berthelot et al., "Highly Reliable TiN/ZrO₂/TiN 3D Stacked Capacitors for 45 nm Embedded DRAM Technologies" in Proc. of ESSDERC 2006, pp. 343-346.

* cited by examiner

*Primary Examiner* — Joseph Schoenholtz
(74) *Attorney, Agent, or Firm* — Muncy, Geissler, Olds & Lowe, P.C.

(57) ABSTRACT

A high breakdown voltage metal-insulator-metal capacitor for compound semiconductor integrated circuit comprises a substrate, an isolation layer, a first metal layer, a dielectric layer, an adhesion layer and a second metal layer. The dielectric layer is formed by alternately stacking plural $HfO_2$ layers and plural $SiO_2$ layers. The thickness of each layer of the plural $HfO_2$ layers is between 30 Å to 100 Å so as to reduce the leakage current, enhance the breakdown voltage and increase the capacitance density of each layer of the plural $HfO_2$ layers. And the total thickness of the dielectric layer is thicker than 500 Å such that the breakdown voltage of the capacitor is higher than 50 V.

18 Claims, 13 Drawing Sheets

HRTEM image of TiN/ZrO₂/TiN Capacitor (Equivalent Oxide Thickness = 9.3A)

Fig. 6

Figure 11. Variation of positive Voltage-to-Breakdown ($V_{bd}$) with EOT for different high-K materials.

Fig. 6A

Figure 4. Relationship between EOT and physical thickness for ALD $ZrO_2$, $HfO_2$ and $Al_2O_3$ films.

HIGH BREAKDOWN VOLTAGE METAL-INSULATOR-METAL CAPACITOR

FIELD OF THE INVENTION

The present invention relates to a high breakdown voltage metal-insulator-metal capacitor for compound semiconductor integrated circuit and mobile phone circuit, wherein the insulator of the capacitor is a dielectric layer which is formed by alternately stacking plural $HfO_2$ layers and plural $SiO_2$ layers with the total thickness thicker than 500 Å and has the features of high capacitance density, low leakage current and high breakdown voltage.

BACKGROUND OF THE INVENTION

A metal-insulator-metal capacitor is widely used. For different applications, the requirement to the breakdown voltage of the metal-insulator-metal capacitor is entirely different. For example, please refer to FIGS. 6, 6A and 6B (that are respectively the FIG. 5, FIG. 11 and FIG. 4 of "Berthelot, A.; Caillat, C.; Huard, V.; Barnola, S.; Boeck, B.; Del-Puppo, H.; Emonet, N. & Lalanne, F. (2006). Highly Reliable TiN/ZrO2/TiN 3D Stacked Capacitors for 45 nm Embedded DRAM Technologies, Proc. of ESSDERC 2006, pp. 343-346, Montreux, Switzerland, September 2006"), which shows that the requirement to the breakdown voltage of the conventional metal-insulator-metal capacitor for the application to the dynamic random access memory (DRAM) is usually lower than 6V.

Figure 6:
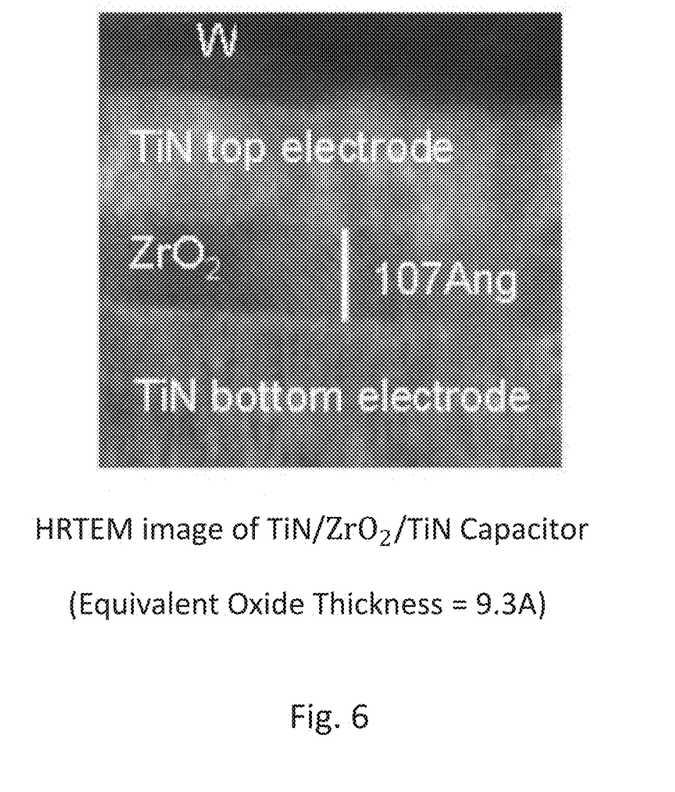
FIG. 6 is the sectional view of HRTEM image of a prior art.
Figure 6A:
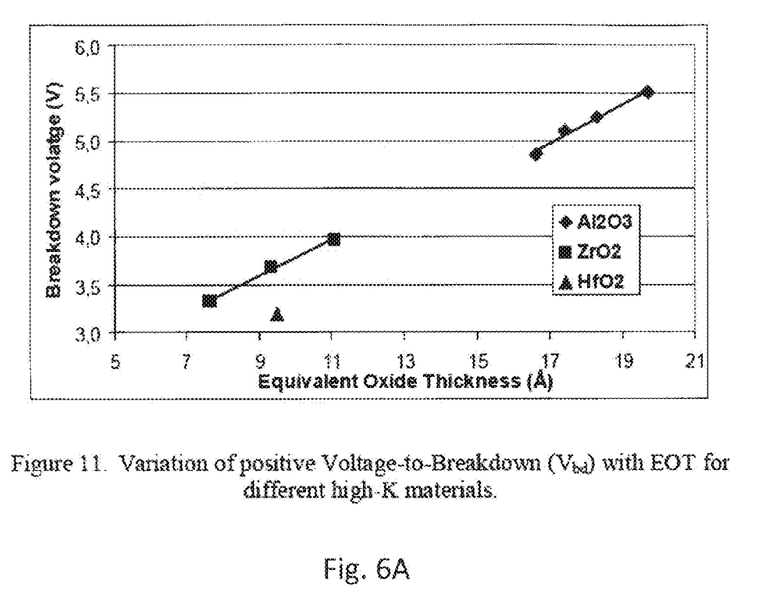
FIGS. 6A and 6B are the diagrams of equivalent oxide thickness-breakdown voltage-material of dielectric layer & thickness of dielectric layer-equivalent oxide thickness-material of dielectric layer of the prior art.
Figure 6B:
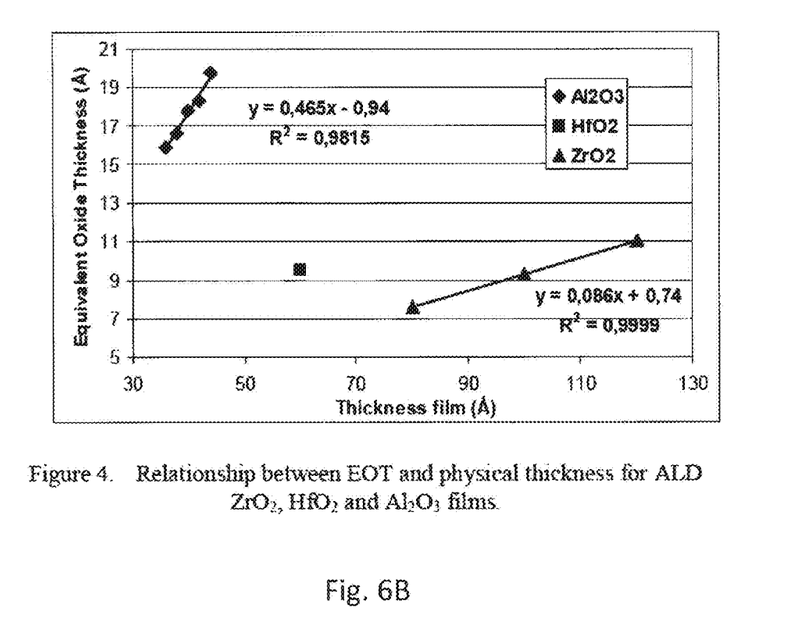

Please refer to FIG. 6, which is the design of the metal-insulator-metal capacitor for the application of DRAM. The design comprises a TiN bottom metal layer, a $ZrO_2$ dielectric layer and a TiN top metal layer. The dielectric layer may be made of $HfO_2$ or $Al_2O_3$. Please also refer to FIGS. 6A and 6B. As an example the dielectric layer is made of $Al_2O_3$, when the thickness of the $Al_2O_3$ film is approaching 50 Å (the effective oxide ($SiO_2$) thickness is about 20 Å), the breakdown voltage of the capacitor is about 5.5V. While in the case of $HfO_2$ dielectric layer and $ZrO_2$ dielectric layer, the breakdown voltage is even lower than 4V. However, on the application of mobile phone circuit, the requirement to the breakdown voltage of the metal-insulator-metal capacitor is up to 50V, which is far beyond the requirement on the application of DRAM.

Not only the gap difference on the requirement of the breakdown voltage, but also the requirement of the lifetime on the application of DRAM is quite different from the requirement on the application of the mobile phone. Time dependent dielectric breakdown lifetime test is the method often used in semiconductor industry to test the reliability of the integrated circuits devices. During testing the metal-insulator-metal capacitor, under high temperature environment and under applying a certain fixed stress voltage on the capacitor, measures the time interval when breakdown occurs. Estimate the lifetime of the capacitor by extrapolation to judge if it fits the requirement of the lifetime test. For DRAM application metal-insulator-metal capacitor, the required lifetime is usually greater than or equal to 10 years ($3.1*10^8$ sec) under applying 3V stress voltage; while for mobile phone application metal-insulator-metal capacitor, the required lifetime should be greater than or equal to 20 years ($6.3*10^8$ sec) under applying 20V stress voltage and at temperature 125° C. Obviously, the design of the metal-insulator-metal capacitor for DRAM application couldn't meet the requirement for mobile phone application no matter the requirement of lifetime or the breakdown voltage.

Figure 7:
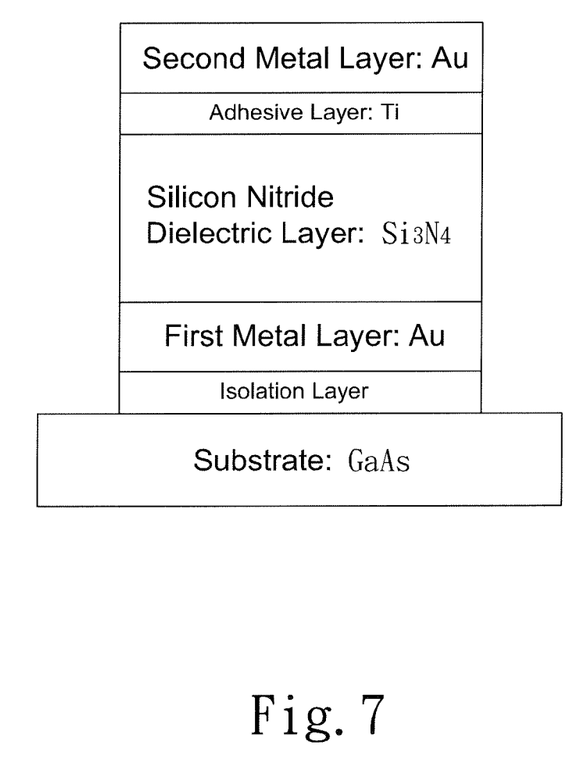
FIG. 7 is the sectional view of a prior art.

Please refer to FIG. 7, which is the sectional view of a prior art metal-insulator-metal capacitor for mobile phone application. On a GaAs substrate, in sequence an isolation layer, a first metal layer (Au), a $Si_3N_4$ dielectric layer, an adhesion layer (Ti) and a second metal layer (Au) are formed. When the thickness of the $Si_3N_4$ dielectric layer is 1000 Å, after the time dependent dielectric breakdown lifetime test under applying 20V stress voltage, the lifetime may be greater than or equal to 20 years ($6.3*10^8$ sec) and may reach the requirement. Its breakdown voltage is 81.5V, which also reaches the requirement for mobile phone application. However, its capacitance density is only 580 (pF/mm2) For dense integrated circuit design, it needs a new design of the metal-insulator-metal capacitor with higher capacitance density.

The design with higher capacitance density means the capacitor having a higher capacitance per unit area. In other words, when the circuit needs a certain fixed capacitance of capacitor, the higher capacitance density the metal-insulator-metal capacitor design has, the smaller area the capacitor needs. For example, when designing the mobile phone circuit, using metal-insulator-metal capacitor design with higher capacitance density will significantly shrink the area of the capacitor. Because a large portion of the area on the mobile phone circuit is occupied by the capacitor, a design of the metal-insulator-metal capacitor with high capacitance density will be able to largely reduce the costs and make the products more competitive.

Accordingly, the inventor develops a new design to overcome the drawback of the conventional metal-insulator-metal capacitor design. The new design of the metal-insulator-metal capacitor passes the time dependent dielectric breakdown lifetime test and has a high capacitance density. Under applying 20V the stress voltage, its lifetime is greater than or equal to 20 years ($6.3*10^8$ sec) and reach the requirement. In the meanwhile, its breakdown voltage is higher than 50V and reaches the requirement for mobile phone application.

SUMMARY OF THE INVENTION

The main object of the present invention is to provide a new design of a metal-insulator-metal (MIM) capacitor to reduce the leakage current and enhance the breakdown voltage of the capacitor. The breakdown voltage is required to be above 50V, in the meanwhile, the MIM capacitor preserves high capacitance density so as to meet the needs of the compound semiconductor integrated circuit and to reduce the cost. Also the MIM capacitor is required to pass the time dependent dielectric breakdown (TDDB) lifetime test for MIM capacitor. The TDDB lifetime is required to achieve greater than or equal to 20 years ($6.3*10^8$ sec) under applying 20V stress voltage.

In order to solve the problems of prior art and to achieve the expected effect stated above, the present invention provides a high breakdown voltage metal-insulator-metal (MIM) capacitor for compound semiconductor integrated circuit, which comprises a substrate, an isolation layer, a first metal layer, a dielectric layer, an adhesion layer and a second metal layer; said isolation layer is formed on said substrate; said first metal layer is formed on said isolation layer; said dielectric layer is formed on said first metal layer; said adhesion layer is formed on said dielectric layer; and said second metal layer is formed on said adhesion layer; wherein said dielectric layer is formed by alternately stacking plural $HfO_2$ layers and plural $SiO_2$ layers.

The thickness of each layer of said plural $HfO_2$ layers is between 30 Å to 100 Å so as to reduce the leakage current, enhance the breakdown voltage and increase the capacitance density of each layer of said plural $HfO_2$ layers.

The total thickness of said dielectric layer is thicker than 500 Å such that the breakdown voltage of said high breakdown voltage MIM capacitor is higher than 50V.

In an embodiment, the total thickness of said dielectric layer is between 500 Å to 1000 Å.

In another embodiment, the thickness of each layer of said plural $SiO_2$ layers is between 5 Å to 50 Å.

In one embodiment, the total thickness of said plural $HfO_2$ layers is between 450 Å to 800 Å.

In an embodiment, the total thickness of said plural $SiO_2$ layers is between 50 Å to 200 Å.

In another embodiment, the ratio of the total thickness of said plural $SiO_2$ layers to the total thickness of said dielectric layer is between 5% to 25%.

The present invention further provides a high breakdown voltage metal-insulator-metal (MIM) capacitor for compound semiconductor integrated circuit, which comprises a substrate, an isolation layer, a first metal layer, a dielectric layer, an adhesion layer and a second metal layer; said isolation layer is formed on said substrate; said first metal layer is formed on said isolation layer; said dielectric layer is formed on said first metal layer; said adhesion layer is formed on said dielectric layer; and said second metal layer is formed on said adhesion layer; wherein said dielectric layer is formed by alternately stacking plural $HfO_2$ layers and plural alternate layers; wherein each of said plural alternate layers is a $SiO_2$ layer or an $Al_2O_3$ layer; and said plural alternate layers include at least one said $SiO_2$ layer and at least one said $Al_2O_3$ layer.

The thickness of each layer of said plural $HfO_2$ layers is between 30 Å to 100 Å so as to reduce the leakage current, enhance the breakdown voltage and increase the capacitance density of each layer of said plural $HfO_2$ layers.

The total thickness of said dielectric layer is thicker than 500 Å such that the breakdown voltage of said high breakdown voltage MIM capacitor is higher than 50V.

In an embodiment, the total thickness of said dielectric layer is between 500 Å to 1000 Å.

In another embodiment, the thickness of each layer of said plural alternate layers is between 5 Å to 100 Å.

In one embodiment, the total thickness of said plural $HfO_2$ layers is between 450 Å to 800 Å.

In an embodiment, the total thickness of said plural alternate layers is between 50 Å to 300 Å.

In another embodiment, the ratio of the total thickness of said plural alternate layers to the total thickness of said dielectric layer is between 5% to 35%.

The present invention further provides a high breakdown voltage metal-insulator-metal (MIM) capacitor for compound semiconductor integrated circuit, which comprises a substrate, an isolation layer, a first metal layer, a dielectric layer, an adhesion layer and a second metal layer; said isolation layer is formed on said substrate; said first metal layer is formed on said isolation layer; said dielectric layer is formed on said first metal layer; said adhesion layer is formed on said dielectric layer; and said second metal layer is formed on said adhesion layer; wherein said dielectric layer is formed by alternately stacking plural $ZrO_2$ layers and plural alternate layers; wherein each of said plural alternate layers is a $SiO_2$ layer or an $Al_2O_3$ layer; and said plural alternate layers include at least one said $SiO_2$ layer.

The thickness of each layer of said plural $ZrO_2$ layers is between 30 Å to 100 Å so as to reduce the leakage current, enhance the breakdown voltage and increase the capacitance density of each layer of said plural $ZrO_2$ layers.

The total thickness of said dielectric layer is thicker than 500 Å such that the breakdown voltage of said high breakdown voltage MIM capacitor is higher than 50V.

In an embodiment, the total thickness of said dielectric layer is between 500 Å to 1000 Å.

In another embodiment, the thickness of each layer of said plural alternate layers is between 5 Å to 100 Å.

In one embodiment, the total thickness of said plural $ZrO_2$ layers is between 450 Å to 800 Å.

In an embodiment, the total thickness of said plural alternate layers is between 50 Å to 300 Å.

In another embodiment, the ratio of the total thickness of said plural alternate layers to the total thickness of said dielectric layer is between 5% to 35%.

For further understanding the characteristics and effects of the present invention, some preferred embodiments referred to drawings are in detail described as follows.

DETAILED DESCRIPTIONS OF PREFERRED EMBODIMENTS

Figure 4:
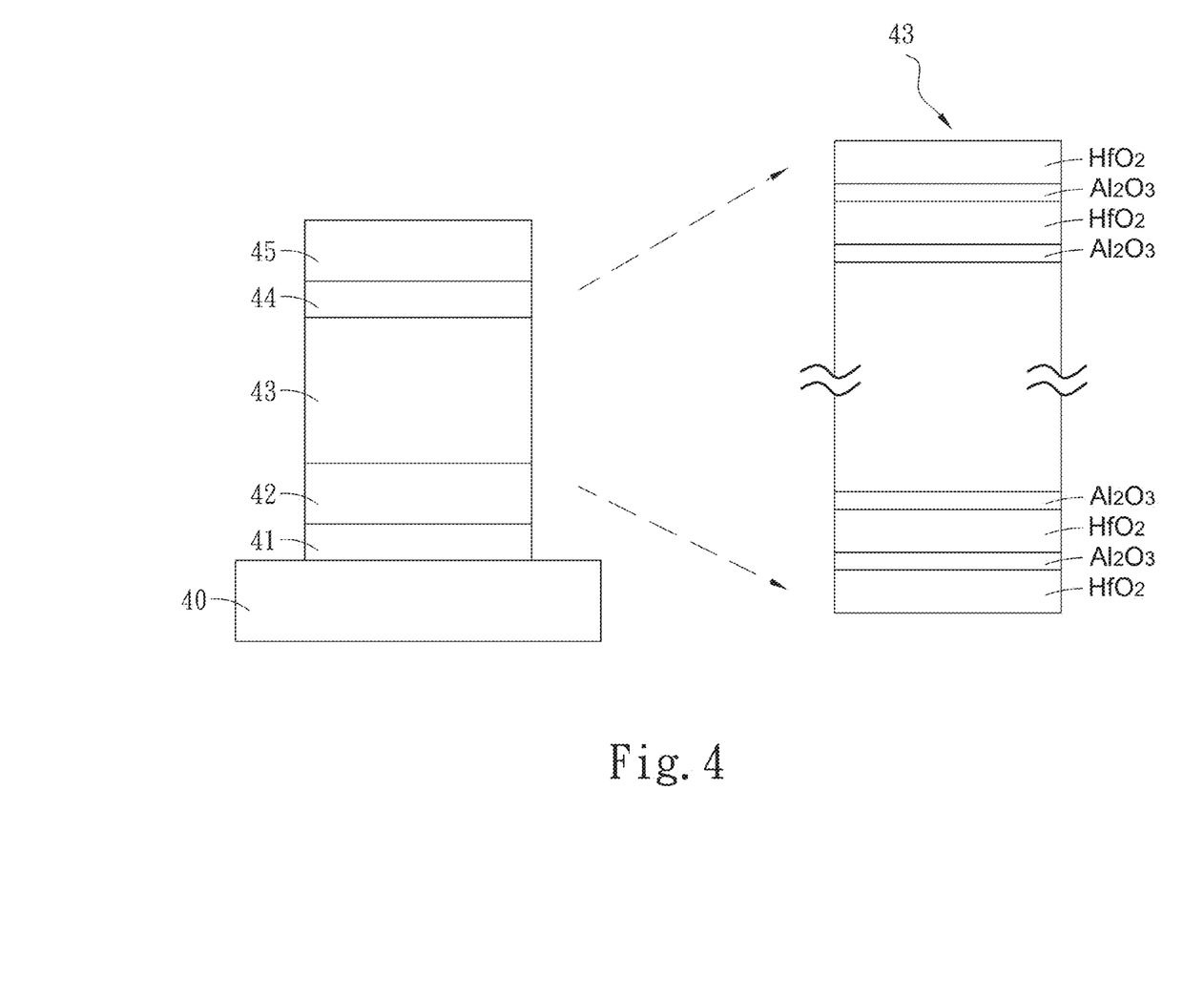
FIG. 4 is the sectional view of one embodiment of the present invention.

Please refer to FIG. 4, which shows the sectional view of one embodiment of the present invention. The high breakdown voltage metal-insulator-metal (MIM) capacitor for compound semiconductor integrated circuit comprises: a substrate 40, an isolation layer 41, a first metal layer 42, a dielectric layer 43, an adhesion layer 44 and a second metal layer 45.

The substrate 40 is usually made of GaAs. The isolation layer 41 is formed on the substrate 40. The isolation layer 41 is usually made of $Si_3N_4$ or $SiO_2$. The first metal layer 42 is formed on the isolation layer 41. The first metal layer 42 is usually made of Au. The dielectric layer 43 is formed on the first metal layer 42. The adhesion layer 44 is formed on the dielectric layer 43. The adhesion layer 44 is usually made of Ti. The second metal layer 45 is formed on the adhesion layer 44. The second metal layer 45 is usually made of Au. The dielectric layer 43 is formed by alternately stacking plural $HfO_2$ layers and plural $Al_2O_3$ layers; wherein the bottom layer of the dielectric layer 43 is one layer of the plural $HfO_2$ layers and the top layer of the dielectric layer 43 is also one layer of the plural $HfO_2$ layers.

Figure 5A:
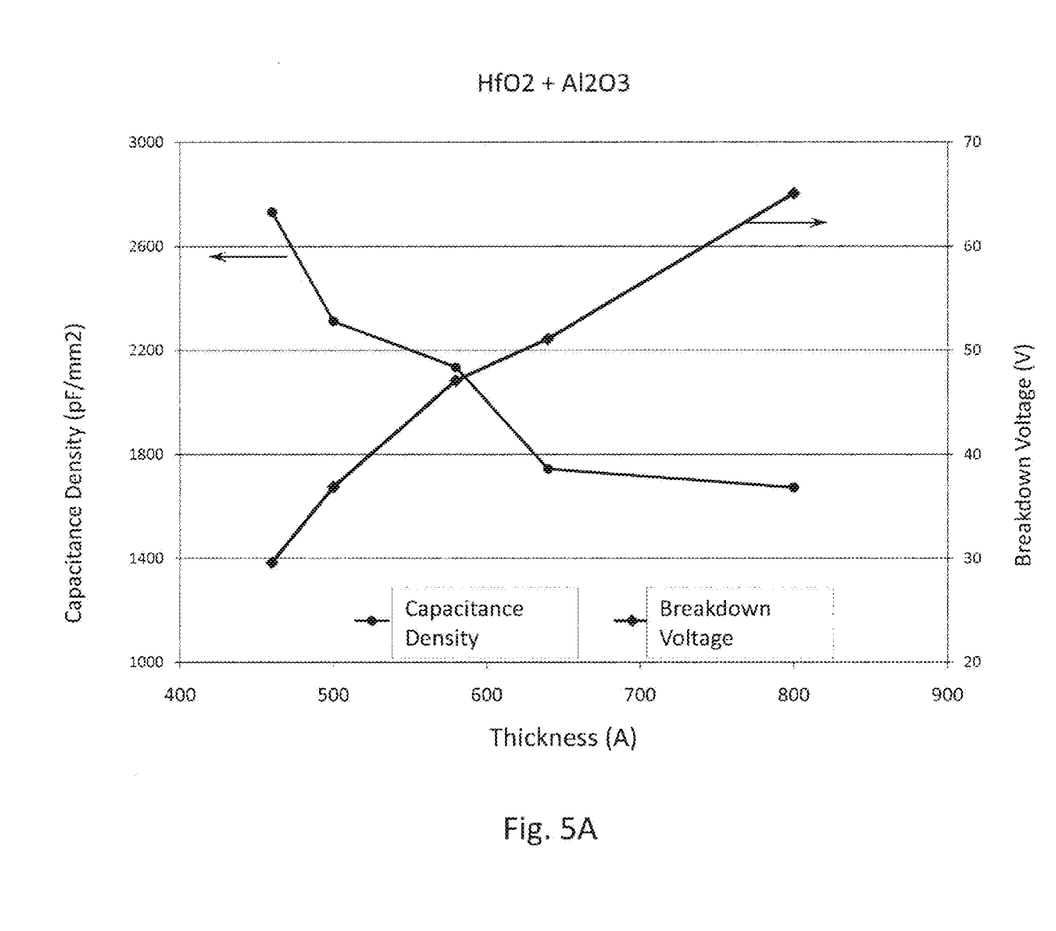
FIG. 5A is the dielectric layer thickness-capacitance density & breakdown voltage diagram of one embodiment of the present invention.

Please refer to FIG. 5A which shows the dielectric layer thickness-capacitance density & breakdown voltage diagram of one embodiment of the present invention. The inventor tests a variety of the thickness of the dielectric layer 43 of the embodiments based on the structure of the design shown in FIG. 4. The result shows that when the thickness of the dielectric layer 43 is thicker, the breakdown voltage of the capacitor is higher. However, as the thickness of the dielectric layer 43 is getting thicker, the capacitance density of the capacitor is getting lower. In the embodiment ($HfO_2+Al_2O_3-$800 Å), the thickness of the dielectric layer 43 is 800 Å, and the breakdown voltage of the capacitor is 65.1V, which is higher than 50V the requirement of the integrated circuit of mobile phone. And the capacitance density of the capacitor is 1673 $pF/mm^2$, which is much higher than 580 $pF/mm^2$ the capacitance density of the prior art ($Si_3N_4-$1000 Å).

Figure 5B:
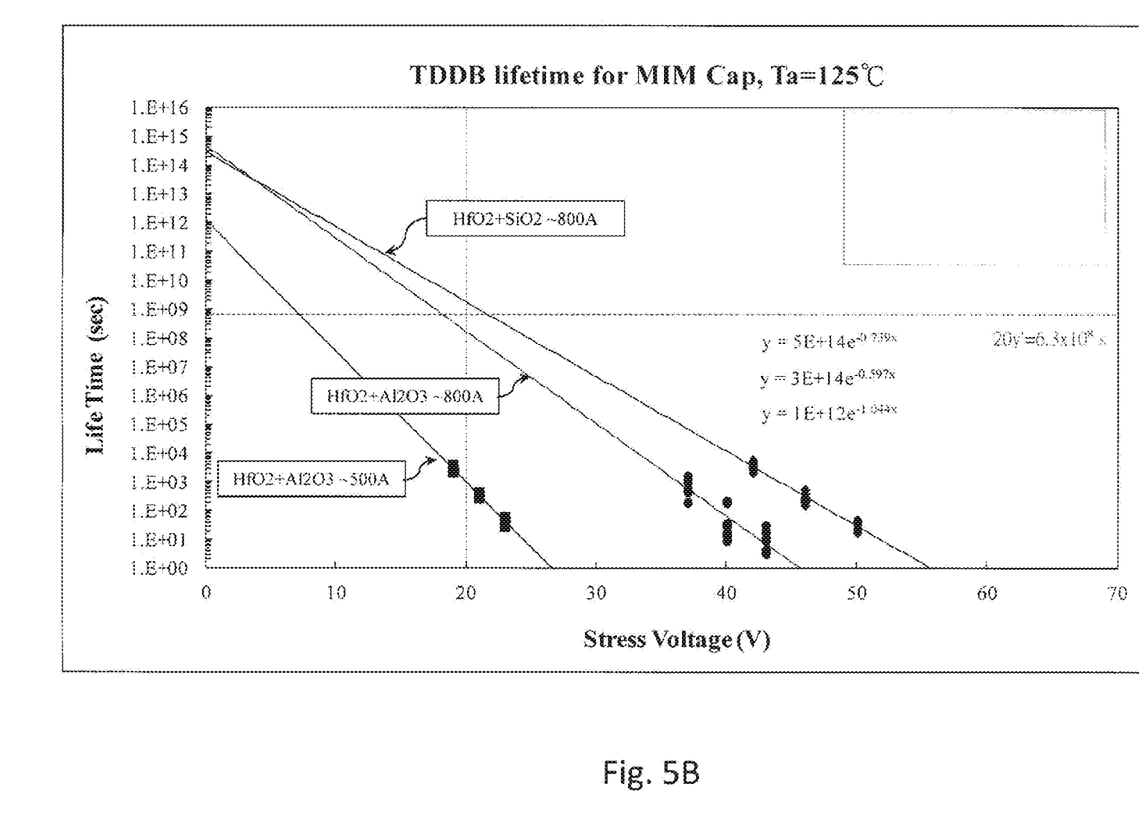
FIG. 5B is the result of comparing the time dependent dielectric breakdown lifetime test of three embodiments of the present invention.

FIG. 5B shows the result of comparing the time dependent dielectric breakdown lifetime test of three embodiments of the present invention. Two of the embodiments are based on the structure of FIG. 4. One ($HfO_2+Al_2O_3-$500 Å) the total thickness of the dielectric layer 43 is 500 Å, the other ($HfO_2+Al_2O_3-$800 Å) the total thickness of the dielectric layer 43 is 800 Å. From the test result, no matter the one ($HfO_2+Al_2O_3-$500 Å) embodiment or the other ($HfO_2+Al_2O_3-$800 Å) embodiment, both couldn't reach the requirement that the lifetime should be greater than or equal to 20 years ($6.3*10^8$ sec) under applying 20V stress voltage. Hence, the inventor continues trying more other dielectric materials and their combinations in order to find a new design which fits the requirement that the lifetime should be greater than or equal to 20 years ($6.3*10^8$ sec) under applying 20V stress voltage, and in the meanwhile has high capacitance density and has a higher than 50V breakdown voltage.

Figure 1:
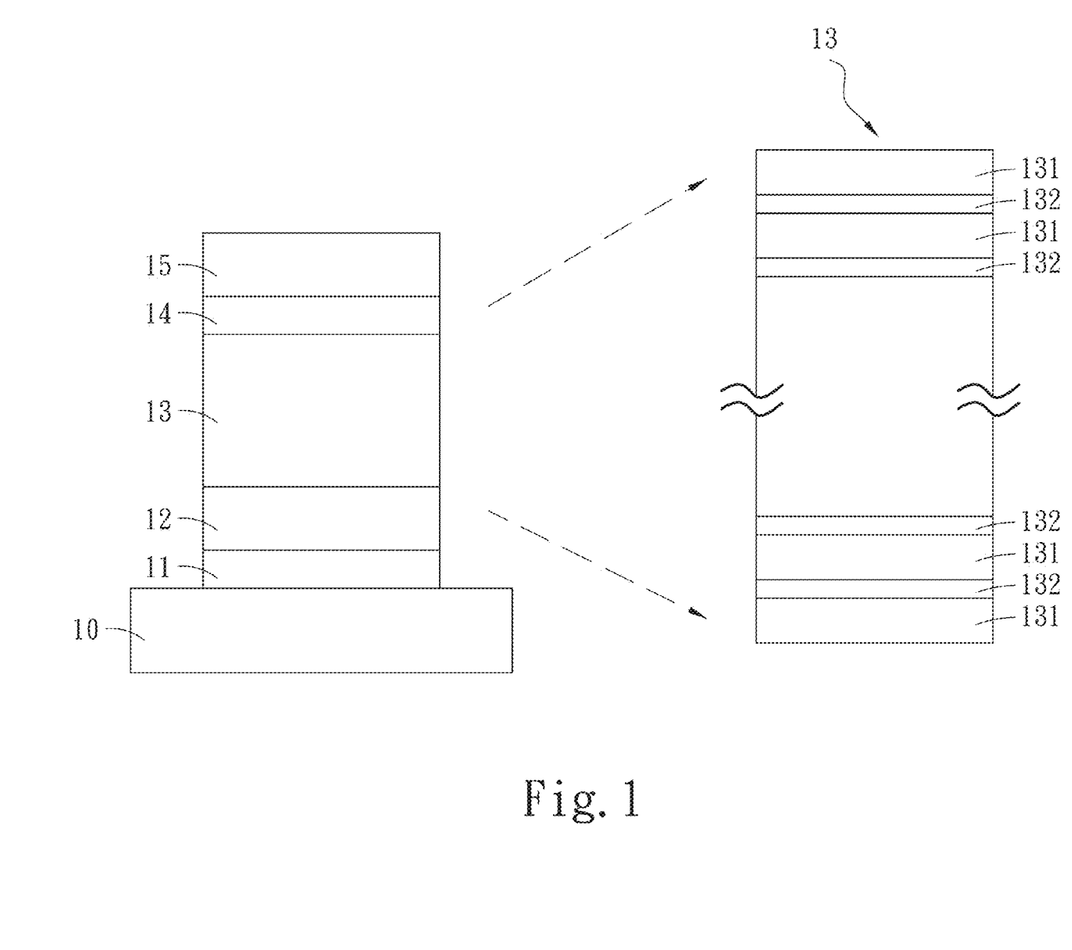
FIG. 1 is the sectional view of an embodiment of the present invention.

Please refer to FIG. 1, which shows the sectional view of an embodiment of the present invention. The high breakdown voltage metal-insulator-metal (MIM) capacitor for compound semiconductor integrated circuit comprises: a substrate 10, an isolation layer 11, a first metal layer 12, a dielectric layer 13, an adhesion layer 14 and a second metal layer 15.

The substrate 10 is usually made of GaAs, InP, GaN or SiC. The isolation layer 11 is formed on the substrate 10. The isolation layer 11 is usually made of $Si_3N_4$ or $SiO_2$. The first metal layer 12 is formed on the isolation layer 11. The first metal layer 12 is usually made of Au. The dielectric layer 13 is formed on the first metal layer 12. The adhesion layer 14 is formed on the dielectric layer 13. The adhesion layer 14 is usually made of Ti. The second metal layer 15 is formed on the adhesion layer 14. The second metal layer 15 is usually made of Au.

Please refer to FIG. 1. And also please refer to 1A, 1B and 1C, which show the sectional view of the dielectric layer of the embodiments of the present invention. The dielectric layer 13 of each of the embodiments is formed by alternately stacking plural $HfO_2$ layers 131 and plural $SiO_2$ layers 132.

In the embodiment of FIG. 1, the bottom layer of the dielectric layer 13 is one layer of the plural $HfO_2$ layers 131 and the top layer of the dielectric layer 13 is also one layer of the plural $HfO_2$ layers 131.

Figure 1A:
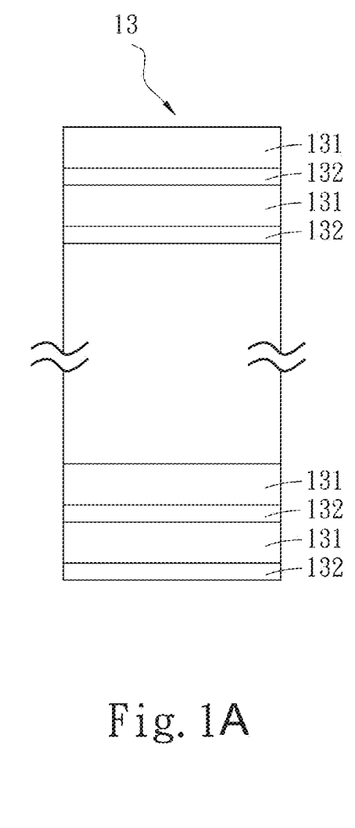
FIGS. 1A, 1B and 1C are the sectional view of the dielectric layer of the embodiments of the present invention.

In the embodiment of FIG. 1A, the bottom layer of the dielectric layer 13 is one layer of the plural $SiO_2$ layers 132 and the top layer of the dielectric layer 13 is one layer of the plural $HfO_2$ layers 131.

Figure 1B:
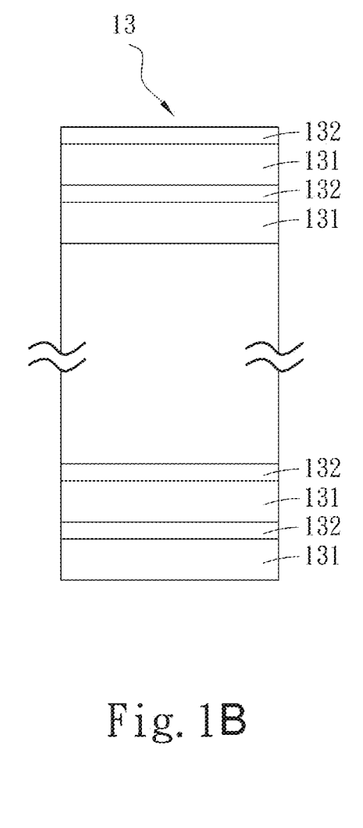

In the embodiment of FIG. 1B, the bottom layer of the dielectric layer 13 is one layer of the plural $HfO_2$ layers 131 and the top layer of the dielectric layer 13 is one layer of the plural $SiO_2$ layers 132.

Figure 1C:
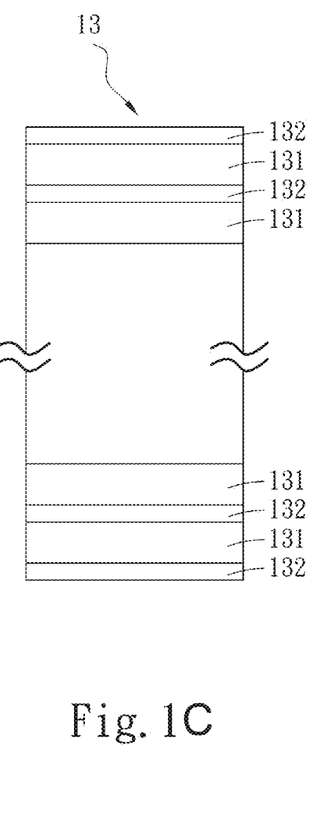

In the embodiment of FIG. 1C, the bottom layer of the dielectric layer 13 is one layer of the plural $SiO_2$ layers 132 and the top layer of the dielectric layer 13 is also one layer of the plural $SiO_2$ layers 132.

In the embodiments of FIGS. 1, 1A, 1B and 1C, the thickness of each layer of the plural $HfO_2$ layers 131 is between 30 Å to 100 Å. Under such a thickness, each layer of the plural $HfO_2$ layers 131 may preferably be preserved in crystallized state, which helps to reduce the leakage current and also enhance the breakdown voltage of the capacitor.

However when the thickness of a single $HfO_2$ layer 131 is thicker than 100 Å, the crystalline quality of $HfO_2$ layer 131 is getting worse, which causes the increase of the leakage current and the lowering of the breakdown voltage of the capacitor. This will affect the characteristics of the product. In order to preserve each layer of the plural $HfO_2$ layers 131 in crystallized state, in the meanwhile, to reduce the leakage current and enhance the breakdown voltage of the capacitor, the present invention provides the design to form the dielectric layer 13 by alternately stacking plural $HfO_2$ layers 131 and plural $SiO_2$ layers 132 to achieve the desired function.

In the embodiments of FIGS. 1, 1A, 1B and 1C, the thickness of each layer of the plural $SiO_2$ layers 132 is between 5 Å to 50 Å. Above or below each layer of the plural $HfO_2$ layers 131 is provided one $SiO_2$ layer 132 such that each layer of the plural $HfO_2$ layers 131 may preferably be preserved in crystallized and the alternately stacked layer of the plural $SiO_2$ layers 132 may significantly enhance the breakdown voltage of the capacitor.

While the total thickness of the dielectric layer 13 which is formed by alternately stacking plural $HfO_2$ layers 131 and plural $SiO_2$ layers 132 is thicker than 500 Å, the breakdown voltage of the capacitor will be enhanced to above 50V, and in the meanwhile preserving with high capacitance density of the capacitor. Hence, the design to form the dielectric layer 13 by alternately stacking plural $HfO_2$ layers 131 and plural $SiO_2$ layers 132 may effectively reduce the leakage current, enhance the breakdown voltage and increase the capacitance density of the capacitor.

In a preferred embodiment, the total thickness of the dielectric layer 13 is between 500 Å to 1000 Å.

In another preferred embodiment, the total thickness of the plural $HfO_2$ layers 131 is between 450 Å to 800 Å.

In a preferred embodiment, the total thickness of the plural $SiO_2$ layers 132 is between 50 Å to 200 Å.

In another preferred embodiment, the ratio of the total thickness of the plural $SiO_2$ layers 132 to the total thickness of the dielectric layer 13 is between 5% to 25%.

Please refer to FIG. 5B. Two of the embodiments are based on the structure of FIG. 4. The total thickness of the dielectric layer 43 of one embodiment ($HfO_2+Al_2O_3-$500 Å) is 500 Å. The total thickness of the dielectric layer 43 the other embodiment ($HfO_2+Al_2O_3-$800 Å) is 800 Å. In FIG. 5B, the third embodiment ($HfO_2+SiO_2-$800 Å) is based on the structure of FIG. 1, in which the total thickness of the dielectric layer 13 is 800 Å. The result shows that the third embodiment ($HfO_2+SiO_2-$800 Å) fits the requirement that the lifetime test is greater than or equal to 20 years ($6.3*10^8$ sec) under applying 20V stress voltage, and in the meanwhile has high capacitance density and a higher than 50V breakdown voltage. Therefore, the structure of the embodiment ($HfO_2+SiO_2$–800 Å) of FIG. 1 is an embodiment meets the requirement of the time dependent dielectric breakdown lifetime test.

Figure 5C:
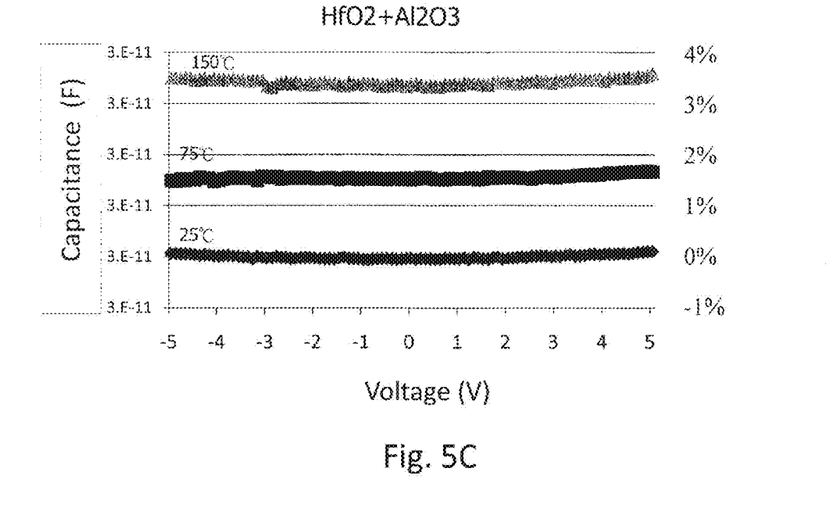
FIGS. 5C and 5D are the diagrams of the voltage-capacitance in different temperature of two embodiments of the present invention.
Figure 5D:
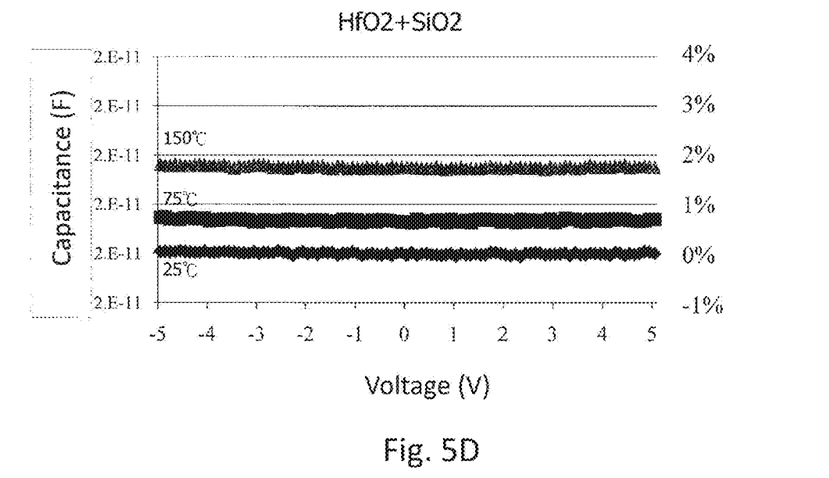

Please refer to FIGS. 5C and 5D, which show diagrams of the voltage-capacitance in different temperature of two embodiments of the present invention. In FIG. 5C shows the diagram of one embodiment ($HfO_2+Al_2O_3$–800 Å), while in FIG. 5D shows the diagram of the other embodiment ($HfO_2+SiO_2$–800 Å). Comparing the diagrams in FIGS. 5C and 5D, for example at 150° C., the percentage of capacitance variation with temperature of the embodiment ($HfO_2+Al_2O_3$–800 Å) is between 3% to 4%, while the percentage of capacitance variation with temperature of the other embodiment ($HfO_2+SiO_2$–800 Å) is lower than 2%. Thus, in present invention, the performance of the capacitance variation with temperature of the embodiment ($HfO_2+SiO_2$–800 Å) with the structure of FIG. 1 is more stable than the performance of the embodiment ($HfO_2+Al_2O_3$–800 Å).

TABLE 1

| Dielectric Material | Capacitance Density (pF/mm$^2$) | Breakdown Voltage (V) |
| --- | --- | --- |
| $Si_3N_4$~1000Å (prior art) | 580 | 81.5 |
| $HfO_2 + Al_2O_3$~800Å | 1673 | 65.1 |
| $HfO_2 + SiO_2$~800Å | 1073 | 86.6 |

Please refer to table 1, which lists the comparison of the capacitance density and the breakdown voltage of the prior art ($Si_3N_4$~1000 Å) and two embodiments of the present invention (embodiment ($HfO_2+Al_2O_3$–800 Å) and embodiment ($HfO_2+SiO_2$–800 Å)). The breakdown voltage of the prior art ($Si_3N_4$~~1000 Å) and two embodiments of the present invention (the embodiment "$HfO_2+Al_2O_3$–800 Å" and the embodiment "$HfO_2+SiO_2$–800 Å") are all above the 50V requirement. While the capacitance density of each of the two embodiments of the present invention (embodiment "$HfO_2+Al_2O_3$–800 Å" and embodiment "$HfO_2+SiO_2$–800 Å") is much higher than the capacitance density of the prior art ($Si_3N_4$~1000 Å). Hence, the designs of the two embodiments of the present invention are more excellent than the prior art ($Si_3N_4$ ~1000 Å). Although the capacitance density of the embodiment ($HfO_2+Al_2O_3$–800 Å) is higher than the capacitance density of the embodiment ($HfO_2+SiO_2$–800 Å), the embodiment ($HfO_2+Al_2O_3$–800 Å) doesn't fit the requirement of the time dependent dielectric breakdown lifetime test while the embodiment ($HfO_2+SiO_2$–800 Å) does fit the requirement. Hence, the embodiment ($HfO_2+SiO_2$–800 Å) with the structure of FIG. 1 is a more excellent embodiment of the present invention and is also more excellent than the design of prior art ($Si_3N_4$~1000 Å).

Figure 2:
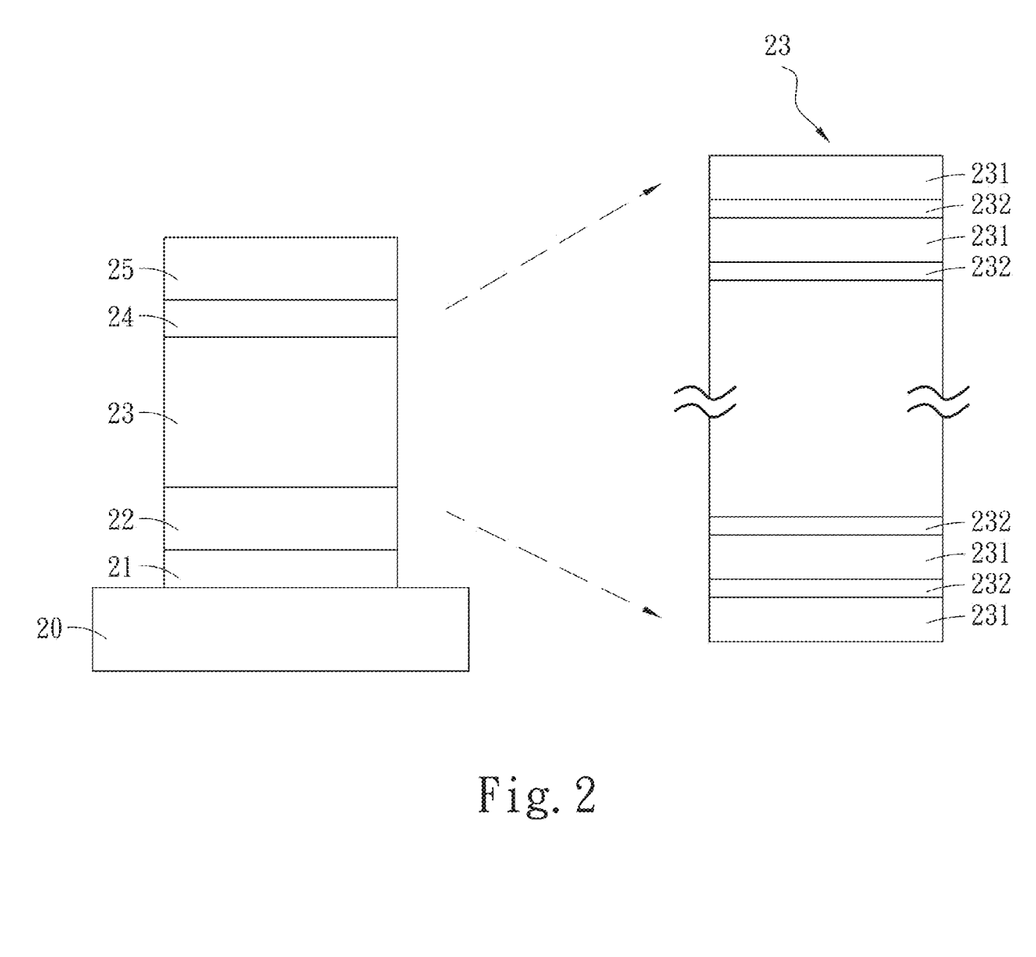
FIG. 2 is the sectional view of another embodiment of the present invention.

Please refer to FIG. 2, which shows the sectional view of another embodiment of the present invention. The high breakdown voltage metal-insulator-metal (MIM) capacitor for compound semiconductor integrated circuit comprises: a substrate 20, an isolation layer 21, a first metal layer 22, a dielectric layer 23, an adhesion layer 24 and a second metal layer 25.

The substrate 20 is usually made of GaAs, InP, GaN or SiC. The isolation layer 21 is formed on the substrate 20. The isolation layer 21 is usually made of $Si_3N_4$ or $SiO_2$. The first metal layer 22 is formed on the isolation layer 21. The first metal layer 22 is usually made of Au. The dielectric layer 23 is formed on the first metal layer 22. The adhesion layer 24 is formed on the dielectric layer 23. The adhesion layer 24 is usually made of Ti. The second metal layer 25 is formed on the adhesion layer 24. The second metal layer 25 is usually made of Au.

Please refer to FIG. 2. And also please refer to 2A, 2B and 2C, which show the sectional view of the dielectric layer of the embodiments of the present invention. The dielectric layer 23 of each of the embodiments is formed by alternately stacking plural $HfO_2$ layers 231 and plural alternate layers 232. Each of the plural alternate layers 232 is a $SiO_2$ layer or an $Al_2O_3$ layer.

In one embodiment, the plural alternate layers 232 include at least one $SiO_2$ layer and at least one $Al_2O_3$ layer.

In the embodiment of FIG. 2, the bottom layer of the dielectric layer 23 is one layer of the plural $HfO_2$ layers 231 and the top layer of the dielectric layer 23 is also one layer of the plural $HfO_2$ layers 231.

Figure 2A:
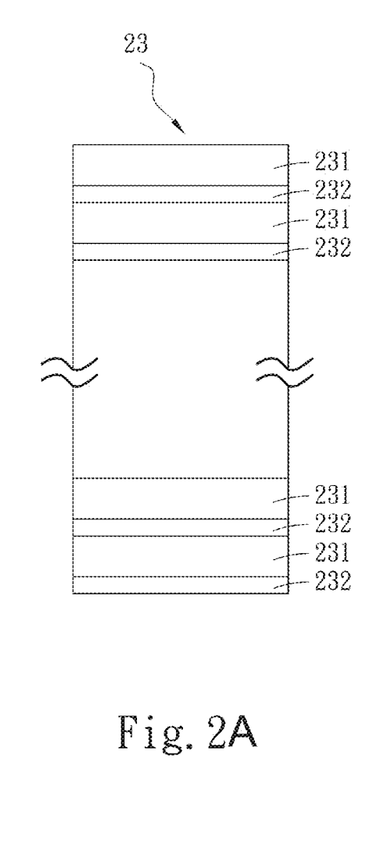
FIGS. 2A, 2B and 2C are the sectional view of the dielectric layer of the embodiments of the present invention.

In the embodiment of FIG. 2A, the bottom layer of the dielectric layer 23 is one layer of the plural alternate layers 232 and the top layer of the dielectric layer 23 is one layer of the plural $HfO_2$ layers 231.

Figure 2B:
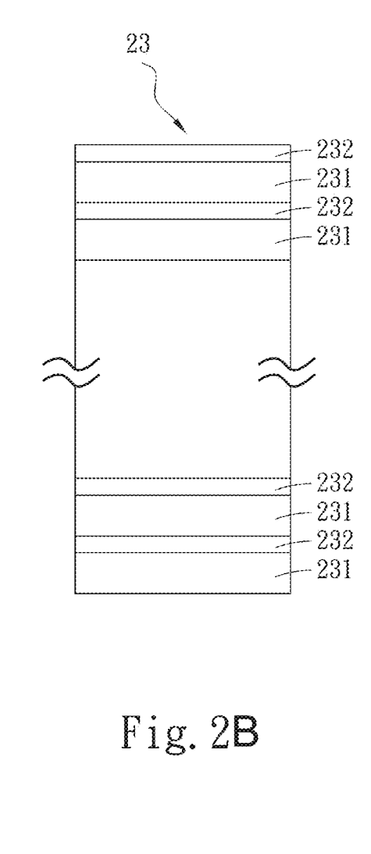

In the embodiment of FIG. 2B, the bottom layer of the dielectric layer 23 is one layer of the plural $HfO_2$ layers 231 and the top layer of the dielectric layer 23 is one layer of the plural alternate layers 232.

Figure 2C:
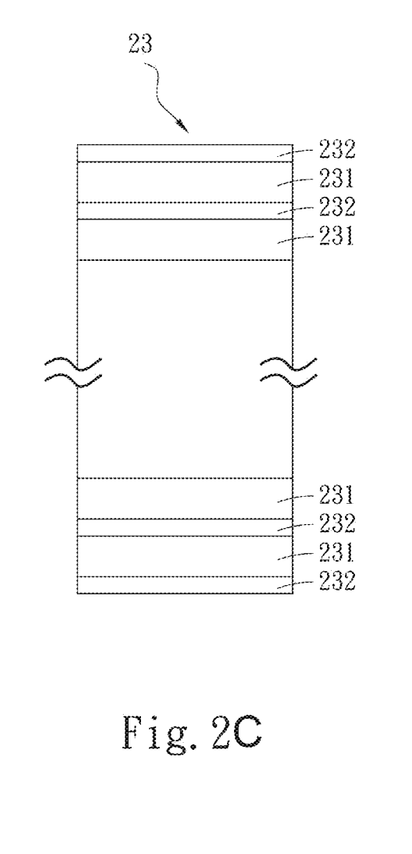

In the embodiment of FIG. 2C, the bottom layer of the dielectric layer 23 is one layer of the plural alternate layers 232 and the top layer of the dielectric layer 23 is also one layer of the plural alternate layers 232.

In the embodiments of FIGS. 2, 2A, 2B and 2C, the thickness of each layer of the plural $HfO_2$ layers 231 is between 30 Å to 100 Å. Under such a thickness, each layer of the plural $HfO_2$ layers 231 may preferably be preserved in crystallized state, which helps to reduce the leakage current and also enhance the breakdown voltage of the capacitor.

However when the thickness of a single $HfO_2$ layer 231 is thicker than 100 Å, the crystalline quality of $HfO_2$ layer 231 is getting worse, which causes the increase of the leakage current and the lowering of the breakdown voltage of the capacitor. This will affect the characteristics of the product. In order to preserve each layer of the plural $HfO_2$ layers 231 in crystallized state, in the meanwhile, to reduce the leakage current and enhance the breakdown voltage of the capacitor, the present invention provides the design to form the dielectric layer 23 by alternately stacking plural $HfO_2$ layers 231 and plural alternate layers 232 to achieve the desired function.

In the embodiments of FIGS. 2, 2A, 2B and 2C, the thickness of each layer of the plural alternate layers 232 is between 5 Å to 100 Å. Each of the plural alternate layers 232 may be a $SiO_2$ layer or an $Al_2O_3$ layer. Above or below each layer of the plural $HfO_2$ layers 231 is provided one alternate layer 232 such that each layer of the plural $HfO_2$ layers 231 may preferably be preserved in crystallized and the alternately stacked layer of the plural alternate layers 232 may significantly enhance the breakdown voltage of the capacitor.

While the total thickness of the dielectric layer 23 which is formed by alternately stacking plural $HfO_2$ layers 231 and plural alternate layers 232 is thicker than 500 Å, the breakdown voltage of the capacitor will be enhanced to above 50V, and in the meanwhile preserving high capacitance density of the capacitor. Hence, the design to form the dielectric layer 23 by alternately stacking plural $HfO_2$ layers 231 and plural alternate layers 232 may effectively reduce the leakage current, enhance the breakdown voltage and increase the capacitance density of the capacitor.

In a preferred embodiment, the total thickness of the dielectric layer 23 is between 500 Å to 1000 Å.

In another preferred embodiment, the total thickness of the plural $HfO_2$ layers 231 is between 450 Å to 800 Å.

In a preferred embodiment, the total thickness of the plural alternate layers 232 is between 50 Å to 300 Å.

In another preferred embodiment, the ratio of the total thickness of the plural alternate layers 232 to the total thickness of the dielectric layer 23 is between 5% to 35%.

Figure 3:
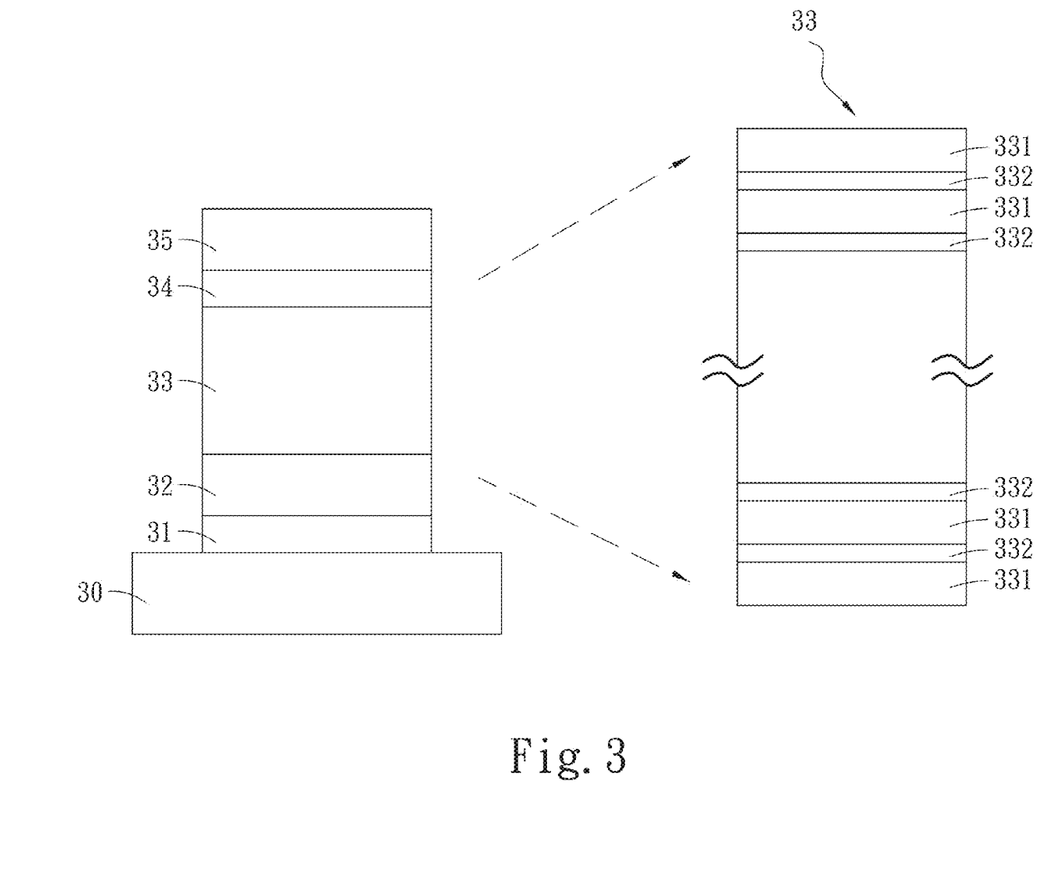
FIG. 3 is the sectional view of the other embodiment of the present invention.

Please refer to FIG. 3, which shows the sectional view of the other embodiment of the present invention. The high breakdown voltage metal-insulator-metal (MIM) capacitor for compound semiconductor integrated circuit comprises: a substrate 30, an isolation layer 31, a first metal layer 32, a dielectric layer 33, an adhesion layer 34 and a second metal layer 35.

The substrate 30 is usually made of GaAs, InP, GaN or SiC. The isolation layer 31 is formed on the substrate 30. The isolation layer 31 is usually made of $Si_3N_4$ or $SiO_2$. The first metal layer 32 is formed on the isolation layer 31. The first metal layer 32 is usually made of Au. The dielectric layer 33 is formed on the first metal layer 32. The adhesion layer 34 is formed on the dielectric layer 33. The adhesion layer 34 is usually made of Ti. The second metal layer 35 is formed on the adhesion layer 34. The second metal layer 35 is usually made of Au.

Please refer to FIG. 3. And also please refer to 3A, 3B and 3C, which show the sectional view of the dielectric layer of the embodiments of the present invention. The dielectric layer 33 of each of the embodiments is formed by alternately stacking plural $ZrO_2$ layers 331 and plural alternate layers 332. Each of the plural alternate layers 332 is a $SiO_2$ layer or an $Al_2O_3$ layer.

In one embodiment, the plural alternate layers 332 include at least one $SiO_2$ layer.

In the embodiment of FIG. 3, the bottom layer of the dielectric layer 33 is one layer of the plural $ZrO_2$ layers 331 and the top layer of the dielectric layer 33 is also one layer of the plural $ZrO_2$ layers 331.

Figure 3A:
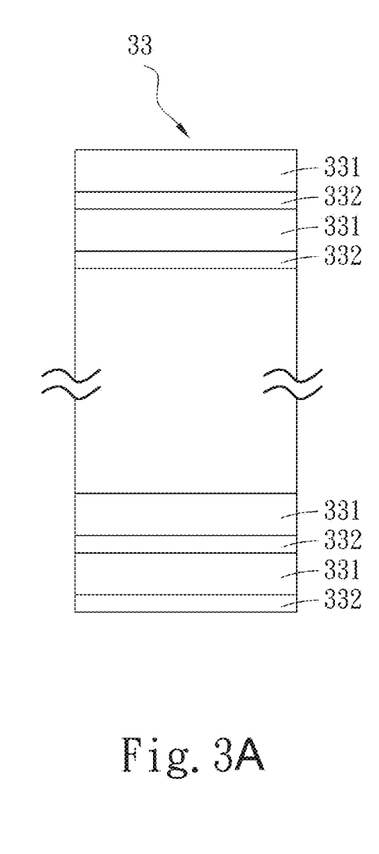
FIGS. 3A, 3B and 3C are the sectional view of the dielectric layer of the embodiments of the present invention.

In the embodiment of FIG. 3A, the bottom layer of the dielectric layer 33 is one layer of the plural alternate layers 332 and the top layer of the dielectric layer 33 is one layer of the plural $ZrO_2$ layers 331.

Figure 3B:
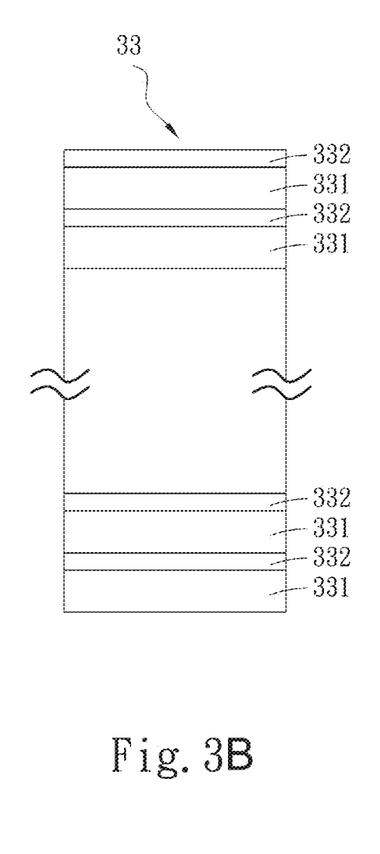

In the embodiment of FIG. 3B, the bottom layer of the dielectric layer 33 is one layer of the plural $ZrO_2$ layers 331 and the top layer of the dielectric layer 33 is one layer of the plural alternate layers 332.

Figure 3C:
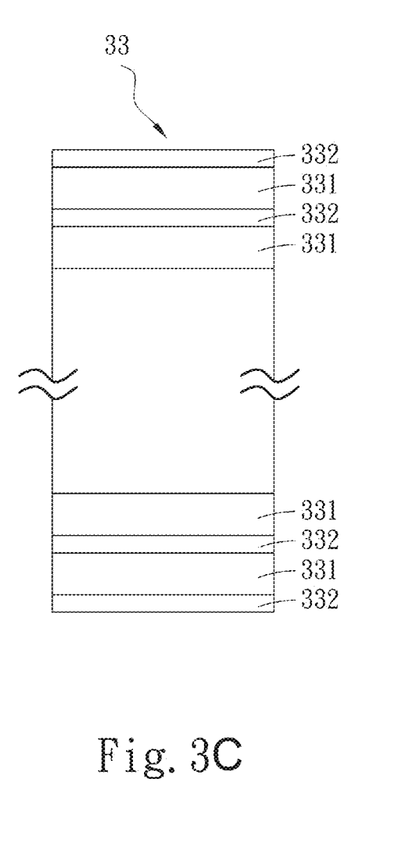

In the embodiment of FIG. 3C, the bottom layer of the dielectric layer 33 is one layer of the plural alternate layers 332 and the top layer of the dielectric layer 33 is also one layer of the plural alternate layers 332.

In the embodiments of FIGS. 3, 3A, 3B and 3C, the thickness of each layer of the plural $ZrO_2$ layers 331 is between 30 Å to 100 Å. Since $ZrO_2$ has similar properties with $HfO_2$, hence under such a thickness, each layer of the plural $ZrO_2$ layers 331 may preferably be preserved in crystallized state too, which helps to reduce the leakage current and also enhance the breakdown voltage of the capacitor.

However when the thickness of a single $ZrO_2$ layer 331 is thicker than 100 Å, the crystalline quality of $ZrO_2$ layer 331 is getting worse, which causes the increase of the leakage current and the lowering of the breakdown voltage of the capacitor. This will affect the characteristics of the product. In order to preserve each layer of the plural $ZrO_2$ layers 331 in crystallized state, in the meanwhile, to reduce the leakage current and enhance the breakdown voltage of the capacitor, the present invention provides the design to form the dielectric layer 33 by alternately stacking plural $ZrO_2$ layers 331 and plural alternate layers 332 to achieve the desired function.

In the embodiments of FIGS. 3, 3A, 3B and 3C, the thickness of each layer of the plural alternate layers 332 is between 5 Å to 100 Å. Each of the plural alternate layers 332 may be a $SiO_2$ layer or an $Al_2O_3$ layer. Above or below each layer of the plural $ZrO_2$ layers 331 is provided one alternate layer 332 such that each layer of the plural $ZrO_2$ layers 331 may preferably be preserved in crystallized and the alternately stacked layer of the plural alternate layers 332 may significantly enhance the breakdown voltage of the capacitor.

While the total thickness of the dielectric layer 33 which is formed by alternately stacking plural $ZrO_2$ layers 331 and plural alternate layers 332 is thicker than 500 Å, the breakdown voltage of the capacitor will be enhanced to above 50V, and in the meanwhile preserving high capacitance density of the capacitor. Hence, the design to form the dielectric layer 33 by alternately stacking plural $ZrO_2$ layers 331 and plural alternate layers 332 may effectively reduce the leakage current, enhance the breakdown voltage and increase the capacitance density of the capacitor.

In a preferred embodiment, the total thickness of the dielectric layer 33 is between 500 Å to 1000 Å.

In another preferred embodiment, the total thickness of the plural $ZrO_2$ layers 331 is between 450 Å to 800 Å.

In a preferred embodiment, the total thickness of the plural alternate layers 332 is between 50 Å to 300 Å.

In another preferred embodiment, the ratio of the total thickness of the plural alternate layers 332 to the total thickness of the dielectric layer 33 is between 5% to 35%.

As disclosed in the above description and attached drawings, the present invention can provide a high breakdown metal-insulator-metal capacitor with high capacitance density for the application of compound semiconductor integrated circuit and mobile phone circuit. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A high breakdown voltage metal-insulator-metal (MIM) capacitor for compound semiconductor integrated circuit comprises:
    a substrate;
    an isolation layer formed on said substrate;
    a first metal layer formed on said isolation layer;
    a dielectric layer formed on said first metal layer, wherein said dielectric layer is formed by alternately stacking plural $HfO_2$ layers and plural $SiO_2$ layers;
    an adhesion layer formed on said dielectric layer; and
    a second metal layer formed on said adhesion layer;
    wherein the thickness of each layer of said plural $HfO_2$ layers is between 30 Å to 100 Å so as to reduce the leakage current, enhance the breakdown voltage and increase the capacitance density of each layer of said plural $HfO_2$ layers; and
    wherein the total thickness of said dielectric layer is thicker than 500 Å such that the breakdown voltage of said high breakdown voltage MIM capacitor is higher than 50V.

2. The high breakdown voltage MIM capacitor according to claim 1, wherein the total thickness of said dielectric layer is between 500 Å to 1000 Å.

3. The high breakdown voltage MIM capacitor according to claim 1, wherein the thickness of each layer of said plural $SiO_2$ layers is between 5 Å to 50 Å.

4. The high breakdown voltage MIM capacitor according to claim 1, wherein the total thickness of said plural $HfO_2$ layers is between 450 Å to 800 Å.

5. The high breakdown voltage MIM capacitor according to claim 1, wherein the total thickness of said plural $SiO_2$ layers is between 50 Å to 200 Å.

6. The high breakdown voltage MIM capacitor according to claim 1, wherein the ratio of the total thickness of said plural $SiO_2$ layers to the total thickness of said dielectric layer is between 5% to 25%.

7. A high breakdown voltage metal-insulator-metal (MIM) capacitor for compound semiconductor integrated circuit comprises:

a substrate;
an isolation layer formed on said substrate;
a first metal layer formed on said isolation layer;
a dielectric layer formed on said first metal layer, wherein said dielectric layer is formed by alternately stacking plural $HfO_2$ layers and plural alternate layers;
an adhesion layer formed on said dielectric layer; and
a second metal layer formed on said adhesion layer;
wherein each of said plural alternate layers is a $SiO_2$ layer or an $Al_2O_3$ layer; and said plural alternate layers include at least one said $SiO_2$ layer and at least one said $Al_2O_3$ layer;
wherein the thickness of each layer of said plural $HfO_2$ layers is between 30 Å to 100 Å so as to reduce the leakage current, enhance the breakdown voltage and increase the capacitance density of each layer of said plural $HfO_2$ layers; and
wherein the total thickness of said dielectric layer is thicker than 500 Å such that the breakdown voltage of said high breakdown voltage MIM capacitor is higher than 50V.

8. The high breakdown voltage MIM capacitor according to claim 7, wherein the total thickness of said dielectric layer is between 500 Å to 1000 Å.

9. The high breakdown voltage MIM capacitor according to claim 7, wherein the thickness of each layer of said plural alternate layers is between 5 Å to 100 Å.

10. The high breakdown voltage MIM capacitor according to claim 7, wherein the total thickness of said plural $HfO_2$ layers is between 450 Å to 800 Å.

11. The high breakdown voltage MIM capacitor according to claim 7, wherein the total thickness of said plural alternate layers is between 50 Å to 300 Å.

12. The high breakdown voltage MIM capacitor according to claim 7, wherein the ratio of the total thickness of said plural alternate layers to the total thickness of said dielectric layer is between 5% to 35%.

13. A high breakdown voltage metal-insulator-metal (MIM) capacitor for compound semiconductor integrated circuit comprises:

a substrate;
an isolation layer formed on said substrate;
a first metal layer formed on said isolation layer;
a dielectric layer formed on said first metal layer, wherein said dielectric layer is formed by alternately stacking plural $ZrO_2$ layers and plural alternate layers;
an adhesion layer formed on said dielectric layer; and
a second metal layer formed on said adhesion layer;
wherein each of said plural alternate layers is a $SiO_2$ layer or an $Al_2O_3$ layer; and said plural alternate layers include at least one said $SiO_2$ layer;
wherein the thickness of each layer of said plural $ZrO_2$ layers is between 30 Å to 100 Å so as to reduce the leakage current, enhance the breakdown voltage and increase the capacitance density of each layer of said plural $ZrO_2$ layers; and
wherein the total thickness of said dielectric layer is thicker than 500 Å such that the breakdown voltage of said high breakdown voltage MIM capacitor is higher than 50V.

14. The high breakdown voltage MIM capacitor according to claim 13, wherein the total thickness of said dielectric layer is between 500 Å to 1000 Å.

15. The high breakdown voltage MIM capacitor according to claim 13, wherein the thickness of each layer of said plural alternate layers is between 5 Å to 100 Å.

16. The high breakdown voltage MIM capacitor according to claim 13, wherein the total thickness of said plural $ZrO_2$ layers is between 450 Å to 800 Å.

17. The high breakdown voltage MIM capacitor according to claim 13, wherein the total thickness of said plural alternate layers is between 50 Å to 300 Å.

18. The high breakdown voltage MIM capacitor according to claim 13, wherein the ratio of the total thickness of said plural alternate layers to the total thickness of said dielectric layer is between 5% to 35%.

* * * * *